(12) United States Patent
Fuse

(10) Patent No.: US 8,808,890 B2
(45) Date of Patent: *Aug. 19, 2014

(54) BATTERY SYSTEM AND BATTERY SAFETY ALARM SYSTEM

(75) Inventor: Kenichi Fuse, Hadano (JP)

(73) Assignee: Empire Technology Development LLC, Wilmington, DE (US)

( * ) Notice: Subject to any disclaimer, the term of this patent is extended or adjusted under 35 U.S.C. 154(b) by 169 days.

This patent is subject to a terminal disclaimer.

(21) Appl. No.: 12/895,494

(22) Filed: Sep. 30, 2010

(65) Prior Publication Data

US 2011/0236735 A1   Sep. 29, 2011

(30) Foreign Application Priority Data

Mar. 29, 2010   (JP) .................................. 2010-75215

(51) Int. Cl.
| | | |
|---|---|---|
| H01M 10/48 | (2006.01) | |
| H01M 2/00 | (2006.01) | |
| G01B 7/16 | (2006.01) | |
| G01B 11/16 | (2006.01) | |
| G01L 1/00 | (2006.01) | |
| G01L 1/24 | (2006.01) | |

(52) U.S. Cl.
USPC ................................ 429/90; 429/61; 324/426

(58) Field of Classification Search
None
See application file for complete search history.

(56) References Cited

U.S. PATENT DOCUMENTS

| | | | |
|---|---|---|---|
| 3,950,075 A | | 4/1976 | Cook et al. |
| 4,342,907 A | | 8/1982 | Macedo et al. |
| 5,104,433 A | * | 4/1992 | Chapin et al. ................. 65/432 |
| 5,212,755 A | * | 5/1993 | Holmberg ..................... 385/107 |
| 5,647,045 A | * | 7/1997 | Robinson et al. ............ 385/135 |
| 5,770,155 A | | 6/1998 | Dunphy et al. |
| 5,850,498 A | | 12/1998 | Shacklette et al. |
| 5,940,209 A | * | 8/1999 | Nguyen ..................... 359/341.1 |
| 5,949,219 A | | 9/1999 | Weiss |
| 6,002,240 A | * | 12/1999 | McMahan et al. ............ 320/150 |

(Continued)

FOREIGN PATENT DOCUMENTS

| | | |
|---|---|---|
| JP | 64-001934 | 1/1989 |
| JP | 01-219612 | 9/1989 |

(Continued)

OTHER PUBLICATIONS

Machine translation of JP 2002-289265, Oct. 4, 2002.*

(Continued)

*Primary Examiner* — Ula C Ruddock
*Assistant Examiner* — Matthew Van Oudenaren
(74) *Attorney, Agent, or Firm* — Maschoff Brennan

(57) ABSTRACT

A battery system that can prevent a burst of a battery and a battery safety alarm system therefor are provided. A battery system includes a lithium ion battery formed in a cylindrical shape and including an organic electrolytic solution as an electrolyte. A laser beam source emits a laser beam. An optical fiber of a single mode is wound around an outer circumferential portion of the lithium ion battery in a plurality of lines and via which the laser beam emitted from the light source is transmitted. A detector receives the laser beam transmitted via the optical fiber and detects abnormality of the lithium ion battery on the basis of a loss of the laser beam due to the optical fiber or a change with time of the loss. An alarm warns a user of the abnormality when abnormality of the lithium ion battery is detected by the detector.

24 Claims, 4 Drawing Sheets

(56) References Cited

U.S. PATENT DOCUMENTS

| | | | |
|---|---|---|---|
| 6,143,440 | A * | 11/2000 | Volz et al. ............... 429/92 |
| 6,174,604 | B1 | 1/2001 | Akita et al. |
| 6,380,710 | B1 | 4/2002 | Watanabe et al. |
| 6,384,607 | B2 | 5/2002 | Horie et al. |
| 6,531,522 | B1 | 3/2003 | Winningham |
| 6,531,847 | B1 | 3/2003 | Tsukamoto et al. |
| 7,283,216 | B1 * | 10/2007 | Geng et al. ............... 356/35.5 |
| 7,545,119 | B1 | 6/2009 | Egan et al. |
| 8,097,352 | B2 | 1/2012 | Fuse |
| 2003/0103552 | A1 * | 6/2003 | Chi et al. ............... 374/137 |
| 2003/0231996 | A1 * | 12/2003 | Shiu et al. ............... 423/179.5 |
| 2008/0018903 | A1 | 1/2008 | Bao et al. |

FOREIGN PATENT DOCUMENTS

| | | |
|---|---|---|
| JP | 04-353731 | 12/1992 |
| JP | 05-272920 | 10/1993 |
| JP | 11-287626 | 10/1999 |
| JP | 2000-173676 | 6/2000 |
| JP | 2001051166 A * | 2/2001 |
| JP | 2002-289265 | 10/2002 |

OTHER PUBLICATIONS

Udd, Eric, Fiber Optic Sensors—An Introduction for Engineers and Scientists, 2006, Wiley-Interscience, pp. 447-449.*

Hirose, Naohiro et al., "Optical Component Coupling using Self-Written Waveguides," Integrated Optics: Devices, Materials, and Technologies VIII, edited by Yakov Sidorin, Ari Tervonen, Proceedings of Spie vol. (SPIE, Bellingham, WA, 2004), pp. 206-214.

Yamashita, Tatsuya et al., "Light-induced Self-written Waveguides for Large Core Optical Fiber Modules," Active and Passive Optical Components for WDM Communications V, Proc. of SPIE vol. 6014, 60140M, (2005), pp. 60140M-1-60140M-8.

Office Action dated Dec. 17, 2010 as received in related U.S. Appl. No. 12/895,544.

Related pending U.S. Appl. No. 13/062,516, filed Mar. 6, 2011.

Office Action dated Apr. 6, 2011 as received in related U.S. Appl. No. 12/895,544.

Polyimide varnish "U-varnish," Ube Industries Ltd., pp. 5, accessed at http://www.ube-ind.co.jp/japanese/products/fine/fine_01_04.htm, last accessed on May 15, 2012.

"Technology to enable three-dimensional design," accessed at http://www.sijapan.com/issue/2007/10/u3eqp300000016ouq.html, accessed on May 15, 2012, pp. 15.

"For forming the coating film / heat-resistant insulation ~ ~ polyimide varnish," accessed at http://www.istcorp.jp/div_cp_var_pyr.htm , accessed on May 15, 2012, pp. 02.

International Search Report and Written Opinion for International Patent Application No. PCT/US2010/054735 mailed on Jan. 20, 2011.

"Environmental future of the car 28 times," accessed at http://tabi-g.com/sigoto/sub0a028.html, accessed on May 15, 2012, pp. 2.

"Lithium-ion battery ," accessed at www.geocities.jp/hiroyuki0620785/battery/lithiumion.htm, accessed on May 15, 2012, pp. 2.

Murase, T. et al., "Development of Small Diameter Optical Fiber," vol. 53, No. 1, pp. 32-36, 2003.

Kusunoki, S. et al., "Development of Bending Loss Insensitive Fiber for 5 mmR," 105, pp. 33-37, Oct. 2008.

"Development of optical fiber radius 2mm NTT, Bend. "Folded" "freely also" signed "and" bending," accessed at http://bb.watch.impress.co.jp/cda/news/11728.html, updated on Aug. 11, 2005, pp. 7.

Battery Association of Japan, Safety Design Guidebook, http://www.baj.or.jp/frombaj/anzen-guide090430.pdf, dated Mar. 2008, Japan.

* cited by examiner

BATTERY SYSTEM AND BATTERY SAFETY ALARM SYSTEM

CROSS REFERENCE TO RELATED APPLICATION

This application is related to U.S. patent application Ser. No. 12/895,544 filed Sep. 30, 2010 and to PCT application PCT/US2010/054735 filed in the U.S. Receiving Office Oct. 29, 2010.

TECHNICAL FIELD

Embodiments of the present disclosure relate to a battery system and a battery safety alarm system therefor.

BACKGROUND

Primary batteries, such as an alkali dry battery and a nickel dry battery, and secondary batteries, such as a lithium ion secondary battery, are used in various electronic apparatuses. In particular, the lithium ion secondary battery (hereinafter simply referred to as "lithium ion battery") is used as a power source for a portable information terminal apparatus such as a cellular phone. The lithium ion battery is light in weight and can be used for a long period because large energy can be stored therein. Further, the lithium ion battery has high energy density, has excellent self-discharge properties (energy retention properties), and substantially has no problem of inter-electrode short-circuit due to deposition of dendrite substances. Therefore, the lithium ion battery is used as a power supply not only for the terminal apparatus but also for a hybrid automobile and the like. It is also expected that the lithium ion battery will be mounted on an electric automobile now under development.

In general, various batteries including the lithium ion battery has high sealing properties. In some cases, battery internal pressure abnormally rises because of overcharge, charge due to reverse mounting, or the like. As precautions for such a case, to prevent a burst of the batteries, safety valves for discharging gas as a cause of an internal pressure rise to the outside of the batteries are usually provided in the batteries.

However, when the safety valves do not normally operate, a burst of the batteries is likely to be caused. In particular, for example, a burst of the lithium ion battery expected to be mounted on an automobile could be a cause of fire.

SUMMARY

For practical use, it is necessary to take all possible protection measures for preventing a burst of the batteries. Therefore, there is a demand for a battery system that can prevent a burst of a battery and a battery safety alarm system therefor.

A battery system according to an embodiment of the present disclosure includes: a battery; a light source that emits light; an optical fiber that is provided in contact with an outer surface portion of the battery (for example, the outer surface portion may be an outer surface of a battery itself in a cell unit or a module unit in which a plurality of the cells are connected or an outer surface of a housing in which the battery is housed) and via which the light emitted from the light source is transmitted; and a detector that receives the light transmitted via the optical fiber and detects abnormality of the battery on the basis of transmission properties of the optical fiber.

In the configuration of the battery system, when external shape of the battery expands according to a rise in a battery internal pressure, lateral pressure acts on the optical fiber that is in contact with the outer surface portion of the battery. The lateral pressure is pressure acting on a side of a fiber. When the lateral pressure acts on the optical fiber, the transmission properties of the optical fiber are deteriorated. Therefore, by measuring a change in the transmission properties (i.e., a transmission loss) due to the optical fiber, it is possible to detect abnormality of the battery with the detector on the basis of a result of the measurement. When abnormality of the battery is detected by the detector in this way, it is possible to prevent a burst of the battery by stopping use of the battery.

For example, the battery system according to an embodiment further includes an alarm that warns, when abnormality of the battery is detected by the detector, a user of the abnormality. Since the user is warned of the abnormality by the alarm, it is possible to promptly inform the user of the abnormality of the battery. "Warn" includes all acts of outputting, communicating, transmitting, and sending an abnormality detection signal by the detector. One of the detector and the alarm may also serve as the other. The detector and the alarm may be separately provided or may be integrally provided.

For example, the detector detects abnormality of the battery on the basis of a loss of light (an absolute value of a transmission loss) due to the optical fiber. Alternatively, the detector detects abnormality of the battery on the basis of a change with time of the loss of light due to the optical fiber.

For example, the battery can be a lithium ion battery. For example, the lithium ion battery can include an organic electrolytic solution as an electrolyte. Since the organic electrolytic solution used in the lithium ion battery tends to have high volatility, it is likely that, when the battery is heated by overcharge or the like, pressure in the battery rises and the battery easily bursts. Therefore, embodiments of the present disclosure can effectively prevent, in particular, a burst of the lithium ion battery.

A mode of the optical fiber is not specifically limited. Examples of the optical fiber include an optical fiber of a single mode. Examples of the light source include a light source that emits a laser beam (a type of a laser is not specifically limited either and is, for example, a semiconductor laser). The optical fiber of the single mode tends to have large characteristic deterioration due to the act of lateral pressure compared with an optical fiber of a multi mode. Specifically, a loss of transmitted light increases with respect to the same change in the external shape of the battery and abnormality in the external shape of the battery is easily detected by the detector. This makes it possible to further improve the sensitivity to a change in the external shape of the battery.

For example, the battery can have a cylindrical (circular cylindrical or angular cylindrical) external shape. For example, the optical fiber can be wound around the outer surface portion of the battery. Consequently, even when the outer surface portion of the battery locally changes, the lateral pressure acts on the optical fiber. Therefore, it is possible to detect abnormality in the external shape of the battery more effectively or with higher sensitivity compared with detection performed when the optical fiber is not wound around the outer surface portion of the battery. Since an area of the optical fiber on which the lateral pressure of the battery acts increases, a change in the transmission properties of light with respect to the lateral pressure increases and it is possible to more effectively and more surely detect abnormality in the external shape of the battery. For example, since the optical fiber is wound around the outer surface portion of the battery in a plurality of lines, it is possible to further improve the sensitivity to abnormality in the external shape of the battery.

Embodiments of the present disclosure are useful when used in an automobile, a cellular phone, a personal computer including the battery system. This makes it possible to provide an automobile, a cellular phone, a personal computer including protection measures that can prevent a burst of the battery.

A battery safety alarm system according to an embodiment of the present disclosure includes: a light source that emits light; an optical fiber that is provided in contact with an outer surface portion of a battery and via which the light emitted from the light source is transmitted; and a detector alarm that receives the light transmitted via the optical fiber, detects abnormality of the battery on the basis of transmission properties of the optical fiber, and warns, when abnormality of the battery is detected, a user of the abnormality.

A battery system according to an embodiment of the present disclosure includes: a lithium ion battery formed in a cylindrical shape and including an organic electrolytic solution as an electrolyte; a laser beam source that emits a laser beam; an optical fiber of a single mode that is wound around an outer circumferential portion of the lithium ion battery in a plurality of lines and via which the laser beam emitted from the light source is transmitted; a detector that receives the laser beam transmitted via the optical fiber and detects abnormality of the lithium ion battery on the basis of a loss of the laser beam due to the optical fiber or a change with time of the loss; and an alarm that warns, when abnormality of the lithium ion battery is detected by the detector, a user of the abnormality.

In the configuration of the battery system, when the external shape of the lithium ion battery expands according to a rise in a battery internal pressure, lateral pressure acts on the optical fiber of the single mode that is in contact with the outer circumferential portion of the lithium ion battery. When the lateral pressure acts on the optical fiber, transmission properties of the optical fiber are deteriorated, and the loss of the laser beam due to the optical fiber increases. Abnormality of the lithium ion battery is detected by the detector on the basis of the loss of the laser beam due to the optical fiber or a change with time of the loss. The user is warned of the abnormality of the lithium ion battery by the alarm. When the user is warned of the abnormality of the lithium ion battery, it is possible to prevent a burst of the lithium ion battery by performing processing or operation for, for example, stopping use of the lithium ion battery.

DETAILED DESCRIPTION

Figure 1:
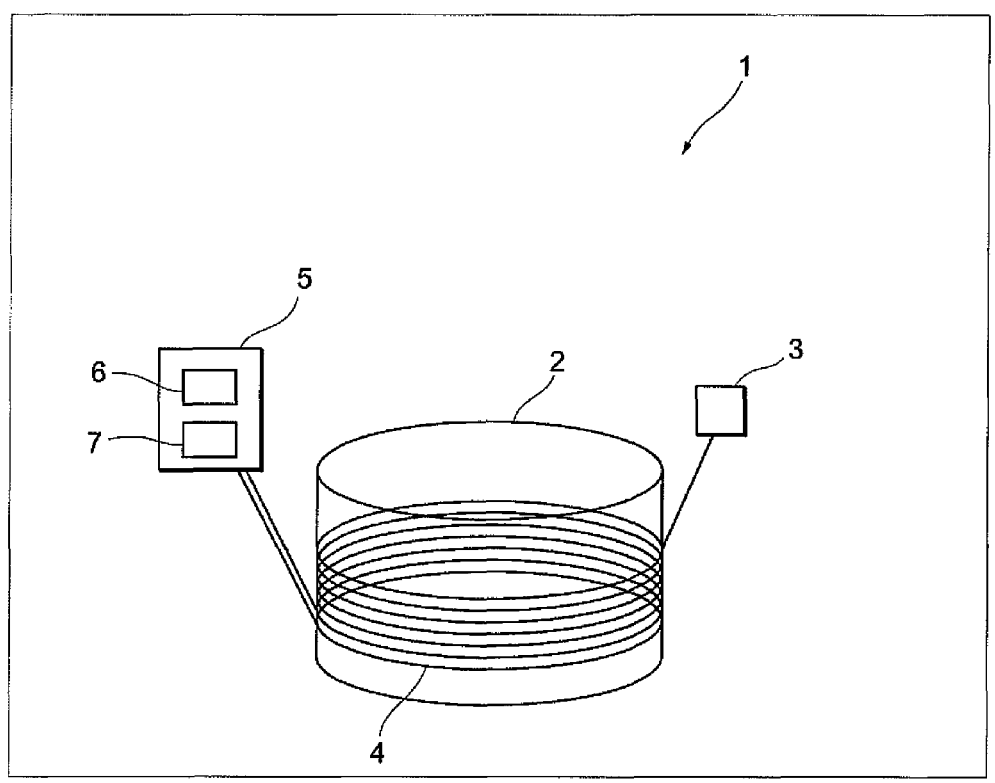
FIG. 1 is a diagram showing a configuration of a battery system according to an embodiment.

An embodiment of the present disclosure is explained below with reference to the accompanying drawings. In the drawings, the same components are denoted by the same reference numerals and redundant explanation of the components is omitted. A positional relation of up and down and left and right is based on a positional relation shown in the drawings unless specifically noted otherwise. A dimensional ratio of the drawings is not limited to a ratio shown in the drawings.

The embodiment is an illustration for explaining the present disclosure and is not meant to limit the present disclosure to only the embodiment. Further, various modifications of the present disclosure are possible without departing from the spirit of the present disclosure.

Figure 2:
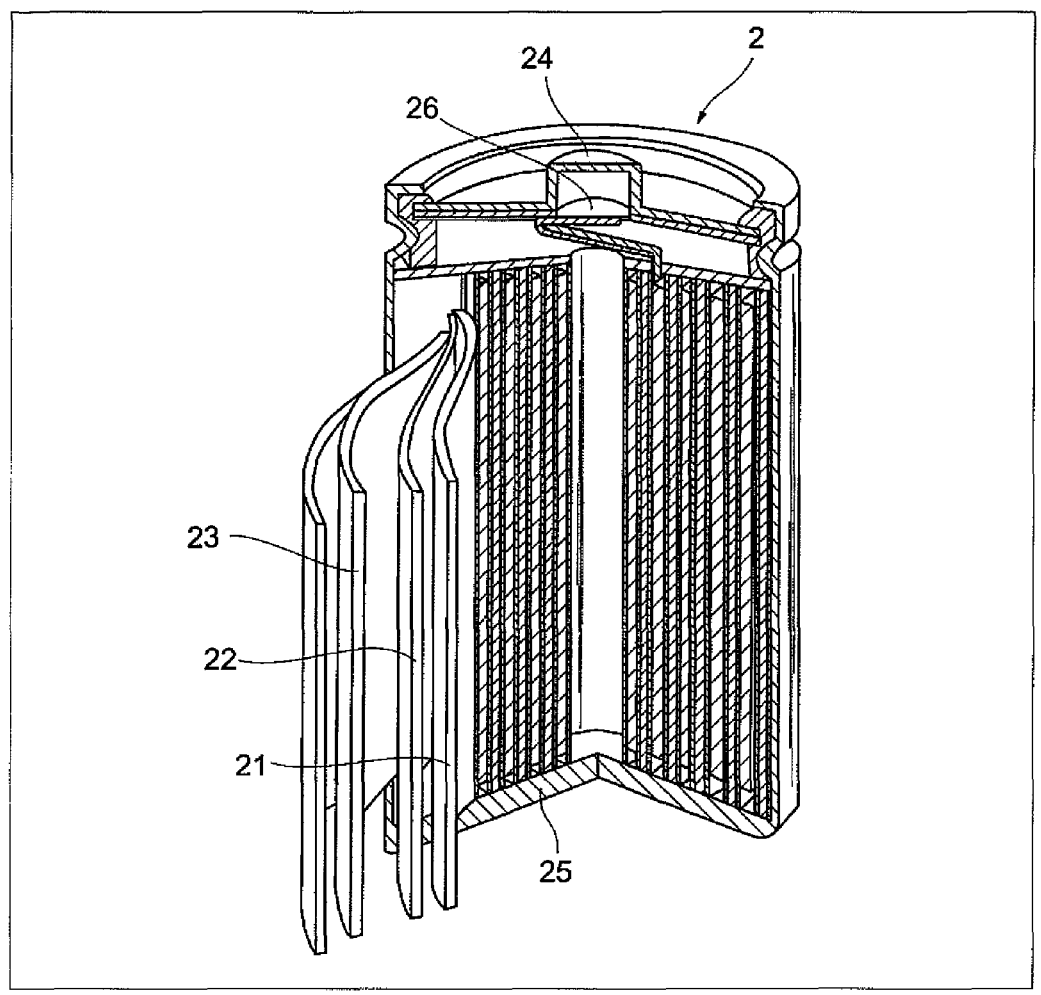
FIG. 2 is a diagram showing a configuration of a lithium ion battery as an example of a battery used in the battery system.

FIG. 1 is a diagram showing a configuration of a battery system according to this embodiment. FIG. 2 is a diagram showing a configuration of a lithium ion battery used in the battery system. A battery system 1 according to this embodiment includes a lithium ion battery 2, a light source 3, an optical fiber 4, and a detector alarm 5 (serving as both a detector and an alarm).

As shown in FIG. 2, the lithium ion battery 2 is packaged in, for example, a cylindrical shape. In the lithium ion battery 2, a large number of sheet-like anodes (positive electrodes) 21, separators 22, and cathodes (negative electrodes) 23 are wound to be superimposed one on top of another around a core section. The anodes 21, the separators 22, and the cathodes 23 are immersed in an electrolytic solution serving as an electrolyte.

The anodes 21 contain a metallic oxide to which lithium ions can be inserted and from which the lithium ions can be detached. A material of the anodes 21 is not specifically limited. The anodes 21 are formed of, for example, lithium cobalt composite oxide ($LiCoO_2$), lithium nickel composite oxide ($LiNiO_2$), lithium manganese composite oxide ($LiMn_2O_2$), or lithium iron composite oxide ($LiFeO_2$).

The separators 22 are provided to retain the electrolytic solution between the anodes 21 and the cathodes 23 and prevent the anodes 21 and the cathodes 23 from coming into contact with each other. A material of the separators 22 is not specifically limited as long as the lithium ions can pass through the material and the material can retain the electrolytic solution. The separators 22 are formed of, for example, porous plastic.

The electrolytic solution impregnated in the separators 22 can be, for example, an organic electrolytic solution containing an organic solvent such as ethylene carbonate or diethyl carbonate and a solute of lithium salt. The organic electrolytic solution has volatility and is likely to raise pressure in the battery when the organic electrolytic solution is heated by over discharge or the like.

The cathodes 23 contain a material to which the lithium ions can be inserted and from which the lithium ions can be detached. A material of the cathodes 23 is not limited. The cathodes 23 are formed of, for example, a carbon material such as graphite.

An anode terminal 24 is electrically connected to the anodes 21 and is formed of, for example, aluminum. A cathode terminal 25 is electrically connected to the cathodes 23 and can be formed of, for example, nickel.

A principle of charge and discharge of the lithium ion battery is explained. When discharging, lithium contained in the cathodes 23 is ionized in the electrolytic solution and passes through the separators 22 to reach the anodes 21. Electrons are released according to the ionization of lithium, whereby the electrons change to electric current flowing in an external circuit. To charge the battery, when voltage is applied to the anode terminal 24 and the cathode terminal 25 from the outside, the lithium ions present in the anodes 21 pass through the separators 22 to return to the cathodes 23 reversely to the discharge. A chemical reaction caused by repetition of the discharge and the charge is a basic principle for the lithium ion battery 2 to function as a secondary battery.

When the lithium ion battery 2 is overcharged, the lithium ion battery 2 is heated. As a result, it is likely that the organic electrolytic solution could volatilize, the pressure in the battery could rise, and the battery package could expand. Such a rise in the pressure in the battery also occurs when impurities are mixed in main components of the battery such as the anodes and the cathodes by mistake. In the lithium ion battery 2 shown in FIG. 2, to prevent such a rise in the pressure in the battery, a safety valve 26 is provided. When the battery internal pressure exceeds a predetermined threshold, the safety valve 26 opens to allow gas in the battery to escape to the outside.

In the battery system 1 according to this embodiment, the light source 3, the optical fiber 4, and the detector alarm 5 are provided as a system for monitoring a change in external shape of the lithium ion battery 2 and preventing a burst of the lithium ion battery 2 even when the safety valve 26 does not normally operate or the safety valve 26 is not provided.

The light source 3 is coupled to one end of the optical fiber 4 and emits light to the optical fiber 4. The light source 3 emits, for example, a laser beam. Wavelength of the laser beam may be appropriately selected according to an environment of use and an application. For example, wavelength of 1.31 μm or 1.55 μm can be used. A type of a laser beam source is not specifically limited either. For example, a semiconductor laser can be used as the laser beam source.

Figure 3:
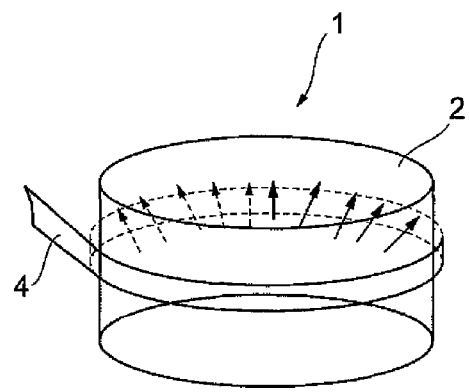
FIG. 3 is a diagram showing lateral pressure acting on the battery system.

The optical fiber 4 is provided to be closely attached to an outer circumferential portion of the lithium ion battery 2. One end of the optical fiber 4 is optically coupled to the light source 3 and the other end thereof is optically coupled to the detector alarm 5. Since the optical fiber 4 is closely attached to the outer circumferential portion of the lithium ion battery 2 in this way, as shown in FIG. 3, when an external shape of the battery increases according to a rise in the pressure in the lithium ion battery 2, tensile force acts on the optical fiber 4. As a result, the lateral pressure acts on the optical fiber 4. When the lateral pressure acts on the optical fiber 4, transmission properties of the optical fiber 4 generally deteriorate and the loss of light due to the optical fiber 4 increases. The loss is detected by the detector alarm 5, whereby abnormality in the external shape of the lithium ion battery 2 can be detected. Therefore, the optical fiber 4 only has to be in contact with the outer circumferential portion of the lithium ion battery 2 and may be wound around the outer circumferential portion of the lithium ion battery 2 in only one line.

By winding the optical fiber 4 around the outer circumferential portion of the lithium ion battery 2 as shown in FIG. 1, even when a part of the outer circumferential portion of the lithium ion battery 2 changes, lateral pressure acts on the optical fiber 4. It is possible to monitor a change in an entire side of the lithium ion battery 2. By winding the optical fiber 4 around the outer circumference of the lithium ion battery 2 in a plurality of lines, it is possible to increase a contact area between the outer circumferential portion of the lithium ion battery 2 and the optical fiber 4. It is possible to increase a change in the transmission properties of the optical fiber 4 with respect to the lateral pressure.

Figure 4:
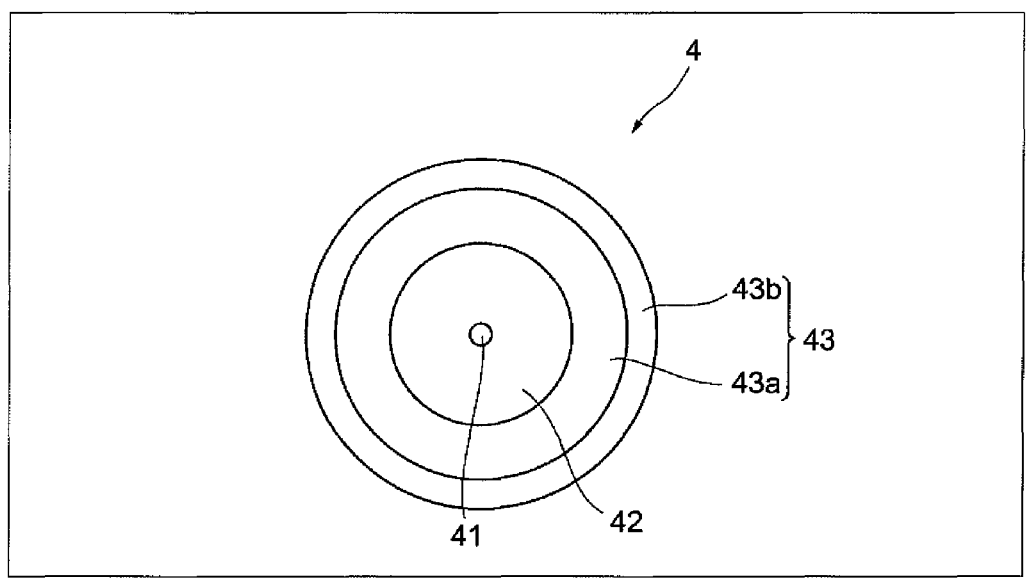
FIG. 4 is a sectional view showing an example of a configuration of the optical fiber used in the battery system.

FIG. 4 is a sectional view showing an example of a configuration of the optical fiber 4. The optical fiber 4 includes a core 41, a clad 42 that covers an outer side of the core 41, and a covering layer 43 that covers an outer side of the clad 42. The optical fiber 4 is formed of, for example, quartz glass or a plastic material.

The core 41 is formed of a material having a refractive index higher than that of the clad 42. When the plastic material is used for the optical fiber 4, for example, fluorine polymer is used for the clad 42. The core 41 is formed of a material having a refractive index higher than that of the fluorine polymer. For example, as the core 41, fully-fluorinated polymer, a methyl polymethacrylate material, polycarbonate, or polystyrene is used. When the quartz glass is used for the optical fiber 4, both of the core 41 and the clad 42 are formed of the quartz glass. To raise the refractive index, for example, germanium or phosphor is added to the core 41. To lower the refractive index, for example, boron or fluorine is added to the clad 42.

Usually, the covering layer 43 has a two-layer structure including a primary covering layer 43a that covers the outer side of the clad 42 and a secondary covering layer 43b that further covers an outer side of the primary covering layer 43a. The primary covering layer 43a is formed to disperse external force and is formed of resin having an elastic modulus smaller than that of the secondary covering layer 43b. The secondary covering layer 43b is formed to compensate for mechanical strength of the optical fiber 4 and is formed of a material having an elastic modulus larger than that of the primary covering layer 43a.

A type and structure of the optical fiber 4 can be appropriately selected according to an environment of use and an application. As an example, a single-mode fiber can be used. The single-mode fiber is a fiber in which an oscillation mode for light to be propagated is single. In the single-mode fiber, a diameter of the core 41 is smaller than that in a multi-mode fiber. The diameter of the core 41 is about 8 μm to 12 μm. By using the single-mode fiber, it is possible to increase a change in the transmission properties with respect to the lateral pressure compared with that in the multi-mode fiber.

In this embodiment, for example, the optical fiber 4 with the covering layer 43 formed as thin as possible and a refractive index ratio ($\Delta$ %) of the core 41 and the clad 42 set as small as possible is used. This makes it possible to increase the change in the transmission properties with respect to the lateral pressure.

In a halfway portion from the light source 3 to the lithium ion battery 2 and a portion from the lithium ion battery 2 to the detector alarm 5, a covering layer for reinforcement may be further formed on an outer side of the covering layer 43 to prevent a change in the transmission properties of the optical fiber 4 due to application of external force other than a change in the external shape of the lithium ion battery 2. As the covering layer for reinforcement, for example, nylon or polyethylene can be used. Alternatively, the optical fiber 4 may be inserted into a pipe for reinforcement. This makes it possible to reduce detection errors due to the external force other than the change in the external shape of the lithium ion battery 2.

Figure 5:
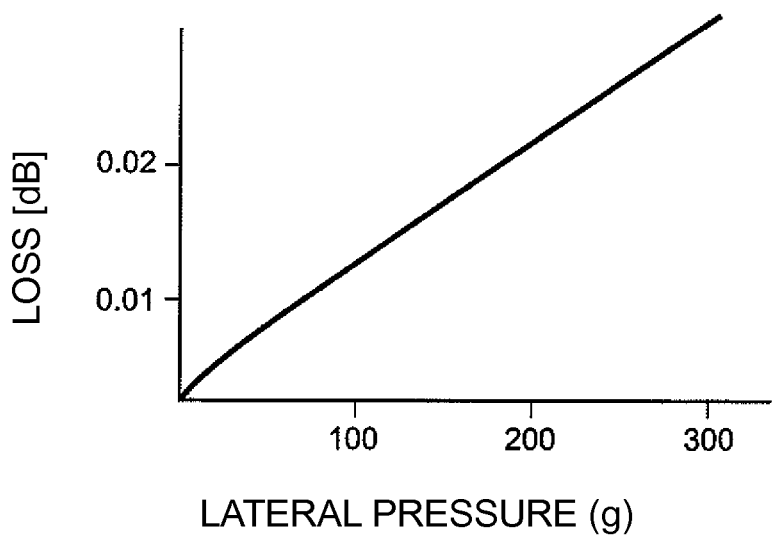
FIG. 5 is a graph showing a relation between the lateral pressure and a loss in the optical fiber.

FIG. 5 is a graph showing an example of a relation between the lateral pressure and a loss in the optical fiber 4. As dimensions of the cylindrical lithium ion battery 2 used in this example, an external diameter was 34.2 mm and length was 61.5 mm. As the optical fiber 4, a single-mode fiber having a clad diameter of 80 μm, an external diameter of 125 μm, and a refractive index ratio of a core and a clad of 0.35% to 0.38% was used. The single-mode fiber was wound around the lithium ion battery 2 over about 50 mm while being closely attached to the lithium ion battery 2 along the external shape thereof. In this case, a minimum bending diameter of the optical fiber 4 was about 5 mm. A laser beam having irradiation wavelength of 1.55 μm was used. As shown in FIG. 5, it was confirmed that the loss increases in proportion to the lateral pressure acting on the optical fiber 4.

The detector alarm 5 receives a laser beam transmitted by the optical fiber 4 and warns a user of abnormality of the lithium ion battery 2 on the basis of a change in the transmission properties of the optical fiber 4 (an increase in a loss of light). Specifically, the detector alarm 5 includes a detector 6 and an alarm 7.

The detector 6 receives a laser beam transmitted by the optical fiber 4 and detects abnormality of the lithium ion battery 2 on the basis of a change in transmission properties of the laser beam due to the optical fiber 4. The detector 6 includes for example an O/E converter (Optical/Electronic signal converter) including a photodiode that converts a light signal from the optical fiber 4 into an electric signal and a control circuit that calculates a loss of light due to the optical fiber 4 on the basis of the electric signal from the O/E converter, compares a threshold set in advance with the loss of the light, and controls the alarm 7 on the basis of a result of the comparison. The detector 6 detects abnormality of the lithium ion battery 2 on the basis of, for example, an absolute value of a loss of a laser beam. In this case, the detector 6 compares the loss of the laser beam with the threshold set in advance and, when the loss of the laser beam is larger than the threshold, detects abnormality of the lithium ion battery 2. The threshold is determined by, for example, measuring the relation between the lateral pressure and the loss in the optical fiber 4 shown in FIG. 5 in advance under an environment in which the lithium ion battery 2 is actually used. Alternatively, the detector 6 may detect abnormality of the lithium ion battery 2 on the basis of an amount of a change with time of the loss of the laser beam. This makes it possible to detect a sudden change in the external shape of the lithium ion battery 2 as abnormality.

When abnormality of the lithium ion battery 2 is detected by the detector 6, the alarm 7 warns the user of the abnormality. For example, the alarm 7 displays the abnormality or sounds an alarm to thereby warn the user of the abnormality.

Operation of the battery system 1 according to this embodiment is explained. A laser beam emitted by the light source 3 is transmitted via the optical fiber 4 and received by the detector 6. An amount of received light of the laser beam transmitted via the optical fiber 4 is monitored and a loss of light is measured by the detector 6. When the external shape of the lithium ion battery 2 changes in response, for example, to a rise in the pressure in the lithium ion battery 2, lateral pressure acts on the optical fiber 4. As a result, the transmission properties of the optical fiber 4 deteriorate. In this case, a loss of the light measured by the detector 6 increases. For example, when the loss of the light reaches a predetermined threshold, a warning (display or sound) is emitted by the alarm 7. When the warning is emitted by the alarm 7, the user only has to stop the use of the lithium ion battery 2. Thereafter, the lithium ion battery 2 is inspected and reused or discarded. Measures taken by the user after the warning is emitted by the alarm 7 is not specifically limited.

As explained above, the present disclosure is not limited to the embodiment. Various modifications of the present disclosure are possible without departing from the spirit of the present disclosure. For example, the optical fiber 4 may be wound around an outer surface of a battery itself in a cell unit or a module unit in which a plurality of the cells are connected or an outer surface of a housing in which the battery is housed. For example, in the embodiment, the lithium ion battery 2 may have a square shape or a coin shape. Structure of the lithium ion battery 2 is not limited. The embodiment can be applied to secondary batteries other than the lithium ion battery, primary batteries such as an alkali dry battery and a nickel dry battery, and fuel batteries.

The battery safety alarm system according to embodiments of the present disclosure can be used in all secondary batteries including the lithium ion battery, primary batteries such as an alkali dry battery and a nickel dry battery, and fuel batteries. The battery system according to embodiments of the present disclosure can be used in an automobile besides all electronic apparatuses including a cellular phone and a personal computer.

What is claimed is:

1. A battery system comprising:
a lithium ion battery formed in a cylindrical shape and including an organic electrolytic solution as an electrolyte;
a laser beam source that emits a laser beam;
an optical fiber of a single mode that is wound around an outer circumferential portion of the lithium ion battery in a plurality of lines and via which the laser beam emitted from the light source is transmitted, the optical fiber including a core, a clad that covers an outer side of the core, and a covering layer that covers an outer side of the clad, wherein the core is formed of a material having a refractive index higher than that of the clad;
a detector including a photodiode that receives the laser beam transmitted via the optical fiber and converts the received laser beam into an electronic signal and a control circuit that detects abnormality of the lithium ion battery from the electronic signal on the basis of an absolute value of a transmission loss of the laser beam caused by lateral pressure acting on the optical fiber;
an alarm that warns, when abnormality of the lithium ion battery is detected by the detector, a user of the abnormality;
a first reinforcement layer that covers an outer side of a portion of the optical fiber that extends between the laser beam source and the lithium ion battery; and
a second reinforcement layer that covers an outer side of a portion of the optical fiber that extends between the lithium ion battery and the detector,
wherein:
the laser beam source that emits the laser beam is located at a first end of the optical fiber, and the detector that receives the laser beam is located at a second end of the optical fiber; and
a reinforcement layer is absent from a portion of the optical fiber that is wound around the outer circumferential portion of the lithium ion battery.

2. A battery system comprising:
a lithium ion battery formed in a cylindrical shape and including an organic electrolytic solution as an electrolyte;
a laser beam source that emits a laser beam;
an optical fiber of a single mode that is wound around an outer circumferential portion of the lithium ion battery in a plurality of lines and via which the laser beam emitted from the light source is transmitted, the optical fiber including a core, a clad that covers an outer side of the core, and a covering layer that covers an outer side of the clad, wherein the core is formed of a material having a refractive index higher than that of the clad;
a detector including a photodiode that receives the laser beam transmitted via the optical fiber and converts the received laser beam into an electronic signal and a control circuit that detects abnormality of the lithium ion battery from the electronic signal on the basis of a change of an absolute value of loss of an amount of the light received by the photodiode with time;
an alarm that warns, when abnormality of the lithium ion battery is detected by the detector, a user of the abnormality;
a first reinforcement layer that covers an outer side of a portion of the optical fiber that extends between the laser beam source and the lithium ion battery; and a second reinforcement layer that covers an outer side of a portion of the optical fiber that extends between the lithium ion battery and the detector, wherein:
the laser beam source that emits the laser beam is located at a first end of the optical fiber, and the detector that receives the laser beam is located at a second end of the optical fiber; and
a reinforcement layer is absent from a portion of the optical fiber that is wound around the outer circumferential portion of the lithium ion battery.

3. A battery system comprising:
a battery;
a light source that emits light;
an optical fiber of a single mode that is wound around an outer surface portion of the battery and via which the light emitted from the light source is transmitted, the optical fiber including a core, a clad that covers an outer side of the core, and a covering layer that covers an outer side of the clad, wherein the core is formed of a material having a refractive index higher than that of the clad;
a detector including a photodiode that receives the light transmitted via the optical fiber and converts the received light into an electronic signal and a control circuit that detects abnormality of the battery from the electronic signal on the basis of a change in transmission properties caused by lateral pressure acting on the optical fiber corresponding to a change in an absolute value of light received by the photodiode;
a first reinforcement layer that covers an outer side of a portion of the optical fiber that extends between the light source and the battery; and
a second reinforcement layer that covers an outer side of a portion of the optical fiber that extends between the battery and the detector, wherein:
the light source that emits the light is located at a first end of the optical fiber, and the detector that receives the light is located at a second end of the optical fiber; and
a reinforcement layer is absent from a portion of the optical fiber that is wound around the outer surface portion of the battery.

4. The battery system according to claim 3, further comprising an alarm that warns, when abnormality of the battery is detected by the detector, a user of the abnormality.

5. The battery system according to claim 3, wherein the battery is a lithium ion battery.

6. The battery system according to claim 5, wherein the lithium ion battery includes an organic electrolytic solution as an electrolyte.

7. The battery system according to claim 3, wherein the light source emits a laser beam.

8. The battery system according to claim 3, wherein the battery has a cylindrical external shape.

9. The battery system according to claim 3, wherein the optical fiber is wound around the outer surface portion of the battery in a plurality of lines.

10. An automobile comprising the battery system according to claim 3.

11. A cellular phone comprising the battery system according to claim 3.

12. A personal computer comprising the battery system according to claim 3.

13. A battery system comprising:
a battery;
a light source that emits light;
an optical fiber of a single mode that is wound around an outer surface portion of the battery and via which the light emitted from the light source is transmitted, the optical fiber including a core, a clad that covers an outer side of the core, and a covering layer that covers an outer side of the clad, wherein the core is formed of a material having a refractive index higher than that of the clad;
a detector including a photodiode that receives the light transmitted via the optical fiber and converts the received light into an electronic signal and a control circuit that detects abnormality of the battery from the electronic signal on the basis of a change with time of an absolute value of an amount of received light;
a first reinforcement layer that covers an outer side of a portion of the optical fiber that extends between the light source and the battery; and
a second reinforcement layer that covers an outer side of a portion of the optical fiber that extends between the battery and the detector, wherein:
the light source that emits the light is located at a first end of the optical fiber, and the detector that receives the light is located at a second end of the optical fiber; and
a reinforcement layer is absent from a portion of the optical fiber that is wound around the outer surface portion of the battery.

14. The battery system according to claim 13, further comprising an alarm that warns, when abnormality of the battery is detected by the detector, a user of the abnormality.

15. The battery system according to claim 13, wherein the battery is a lithium ion battery.

16. The battery system according to claim 15, wherein the lithium ion battery includes an organic electrolytic solution as an electrolyte.

17. The battery system according to claim 13, wherein the light source emits a laser beam.

18. The battery system according to claim 13, wherein the battery has a cylindrical external shape.

19. The battery system according to claim 13, wherein the optical fiber is wound around the outer surface portion of the battery in a plurality of lines.

20. An automobile comprising the battery system according to claim 13.

21. A cellular phone comprising the battery system according to claim 13.

22. A personal computer comprising the battery system according to claim 13.

23. A battery safety alarm system comprising:
a light source that emits light;
an optical fiber of a single mode that is wound around an outer surface portion of a battery and via which the light emitted from the light source is transmitted, the optical fiber including a core, a clad that covers an outer side of the core, and a covering layer that covers an outer side of the clad, wherein the core is formed of a material having a refractive index higher than that of the clad;
a detector alarm including a photodiode that receives the light transmitted via the optical fiber and converts the received light into an electronic signal and a control circuit that detects abnormality of the battery from the electronic signal on the bases of a change in transmission properties caused by lateral pressure acting on the optical fiber corresponding to a change in an absolute value of light received by the photodiode, and warns, when abnormality of the battery is detected, a user of the abnormality;

a first reinforcement layer that covers an outer side of a portion of the optical fiber that extends between the light source and the battery; and a second reinforcement layer that covers an outer side of a portion of the optical fiber that extends between the battery and the detector alarm, wherein:
  the light source that emits the light is located at a first end of the optical fiber, and the detector alarm that receives the light is located a second end of the optical fiber;
and
  a reinforcement layer is absent from a portion of the optical fiber that is wound around the outer surface portion of the battery.

24. A battery safety alarm system comprising:

a light source that emits light;

an optical fiber of a single mode that is wound around an outer surface portion of a battery and via which the light emitted from the light source is transmitted, the optical fiber including a core, a clad that covers an outer side of the core, and a covering layer that covers an outer side of the clad, wherein the core is formed of a material having a refractive index higher than that of the clad; and a detector alarm that receives the light transmitted via the optical fiber and detects abnormality of the battery on the basis of a change in transmission properties caused by lateral pressure acting on the optical fiber corresponding to a change in an absolute value of light received by the photodiode, and warns, when abnormality of the battery is detected, a user of the abnormality;

wherein the light source that emits the light is located at a first end of the optical fiber, and the detector alarm that receives the light is located at a second end of the optical fiber.

* * * * *